United States Patent
Kurita

(10) Patent No.: US 8,124,501 B2
(45) Date of Patent: Feb. 28, 2012

(54) METHOD OF PRODUCING SEMICONDUCTOR WAFER

(75) Inventor: Kazunari Kurita, Tokyo (JP)

(73) Assignee: SUMCO Corporation, Tokyo (JP)

( * ) Notice: Subject to any disclaimer, the term of this patent is extended or adjusted under 35 U.S.C. 154(b) by 0 days.

(21) Appl. No.: 12/436,711

(22) Filed: May 6, 2009

(65) Prior Publication Data

US 2009/0280623 A1 Nov. 12, 2009

(30) Foreign Application Priority Data

May 7, 2008 (JP) ................... 2008-121602

(51) Int. Cl.
*H01L 21/322* (2006.01)
(52) U.S. Cl. .......... 438/473; 257/E21.318; 257/E21.347
(58) Field of Classification Search .................. 438/471, 438/473; 257/E21.318, E21.347
See application file for complete search history.

(56) References Cited

U.S. PATENT DOCUMENTS 4,521,256 A * 6/1985 Hiraki et al. .................. 438/522
(Continued)

FOREIGN PATENT DOCUMENTS

EP 1 537 938 A2 6/2005
(Continued)

OTHER PUBLICATIONS

Korean Office Action of Nov. 18, 2011 and English translation thereof.

*Primary Examiner* — Alexander Ghyka
*Assistant Examiner* — Stanetta D Isaac
(74) *Attorney, Agent, or Firm* — Kilpatrick Townsend & Stockton LLP

(57) ABSTRACT

A semiconductor wafer is produced by irradiating a laser beam to either face of a semiconductor wafer so as to fit a focusing position into a given depth position of the semiconductor wafer to generate a multiphoton absorption process only in a specific portion of the semiconductor wafer at the given depth position to thereby form a gettering sink.

7 Claims, 3 Drawing Sheets

U.S. PATENT DOCUMENTS

| | | | |
|---|---|---|---|
| 5,162,241 A * | 11/1992 | Mori et al. | 438/402 |
| 2005/0237895 A1 | 10/2005 | Tanaka et al. | |
| 2006/0040472 A1* | 2/2006 | Tamura et al. | 438/460 |
| 2006/0116000 A1* | 6/2006 | Yamamoto | 438/795 |
| 2006/0192845 A1* | 8/2006 | Cordingley et al. | 347/252 |
| 2007/0111478 A1* | 5/2007 | Komura et al. | 438/462 |
| 2007/0207595 A1* | 9/2007 | Kurita | 438/473 |
| 2008/0096368 A1* | 4/2008 | Sakai | 438/473 |

FOREIGN PATENT DOCUMENTS

| | | |
|---|---|---|
| JP | 2005-167281 A | 6/2005 |
| JP | 2007-245173 A | 9/2007 |

* cited by examiner

METHOD OF PRODUCING SEMICONDUCTOR WAFER

CROSS REFERENCES TO RELATED APPLICATIONS

This application claims priority to Japanese Patent Application No. 2008-121602, filed May 7, 2008, the disclosure of which is incorporated by reference herein.

BACKGROUND OF THE INVENTION

1. Field of the Invention

This invention relates to a method of producing a semiconductor wafer suitable for use in solid imaging devices or the like, particularly a semiconductor wafer capable of effectively suppressing heavy metal contamination, which is a cause of white defects, even when the wafer has a large diameter of not less than 300 mm.

2. Description of the Related Art

Recently, a high-performance solid imaging device using a semiconductor is mounted onto a mobile phone or a digital video camera, and hence the performances such as number of pixels and the like are dramatically improved. As the performance to be expected in the consumer solid imaging device are a higher pixel count and an ability of taking moving images, and further miniaturization is required. In order to take moving images, it is required to combine the imaging device with a high-speed computing device and a memory device. For this end, a CMOS image sensor facilitating System on Chip (SoC) is used and the downsizing of the CMOS image sensor is developed.

A dark leakage current of a photodiode becomes a problem as a factor of deteriorating the imaging properties of the solid imaging device. The cause of the dark leakage current is heavy metal contamination during processing steps. In order to suppress the heavy metal contamination, it is attempted to form a gettering sink for heavy metal at an inside or a back face of a semiconductor wafer.

As a means for forming the gettering sink at the inside of the semiconductor wafer is mentioned, for example, a method of subjecting a semiconductor wafer to a heat treatment to form an oxygen precipitation portion inside the semiconductor wafer. In this method, however, a long-time heat treatment is required for forming the given oxygen precipitation portion, so that there are feared the increase in production cost and heavy metal contamination at the step of the heat treatment.

As a means for forming the gettering sink at the back face of the semiconductor wafer is mentioned, for example, a method of forming a polycrystalline silicon layer on the back face of the semiconductor wafer and using such a back face as a gettering sink. Especially when the semiconductor wafer has a large diameter of 300 mm or the like, however, it is difficult to form the gettering sink on the back face thereof since such a large-diameter wafer is usually a wafer to be polished on both surfaces thereof.

Therefore, it is desired to develop a method wherein a gettering sink is formed inside a semiconductor wafer without requiring a long-time heat treatment even when the wafer has a large diameter of not less than 300 mm.

SUMMARY OF THE INVENTION

It is an object of the invention to provide a method of producing a semiconductor wafer, in which a modified portion is formed and utilized as a gettering sink by using a rationalized low-power laser and generating a multiphoton absorption process only in a given depth position of a semiconductor wafer through a short-time irradiation of a laser beam thereof.

The inventor has made various studies in order to form a gettering sink inside a semiconductor wafer in a short time, and found that a modified portion is formed by generating a multiphoton absorption process only in a given depth position of a semiconductor wafer by irradiating a low-power laser beam from the surface of the wafer and can be utilized as a gettering sink.

In JP-A-2007-245173 is disclosed a method of divisionally processing a semiconductor wafer, in which a laser beam is irradiated so as to fit a focusing point thereof into an inside of a semiconductor wafer to form a fragile modified region in the vicinity of the focusing point and then the wafer is divided from the modified region.

In the method of JP-A-2007-245173, however, the modified region is formed by irradiating a high-power laser beam such as a YAG laser for the purpose of divisionally processing the semiconductor wafer, so that dislocations and the like affected by such a laser beam energy are frequently caused even at sites other than the vicinity of the focusing point. Moreover, since the high-power laser is used for laser division processing, it is considered that the modified region is formed on the semiconductor wafer in a depth direction at the irradiating position.

The invention is based on the above knowledge and its summary and construction of the invention are as follows:

1. A method of producing a semiconductor wafer, which comprises irradiating a laser beam to either face of a semiconductor wafer so as to fit a focusing position into a given depth position of the semiconductor wafer to generate a multiphoton absorption process only in a specific portion of the semiconductor wafer at the given depth position to thereby form a gettering sink.

2. A method of producing a semiconductor wafer according to the item 1, wherein the laser beam has a property of permeating into the given depth position of the semiconductor wafer and generating the multiphoton absorption process only in the specific portion of the semiconductor wafer at the given depth position.

3. A method of producing a semiconductor wafer according to the item 1 or 2, wherein the laser beam is an ultrashort pulsed-laser.

According to the invention, it is made possible to produce a semiconductor wafer provided with a modified portion by generating a multiphoton absorption process only at a given depth position of the semiconductor wafer through irradiation of a laser beam for a short time and to utilize the modified portion as a gettering sink even when the wafer has a large diameter of not less than 300 mm.

BRIEF DESCRIPTION OF THE DRAWINGS

The invention will be described with reference to the accompanying drawings, wherein.

DESCRIPTION OF THE PREFERRED EMBODIMENTS

Figure 1:
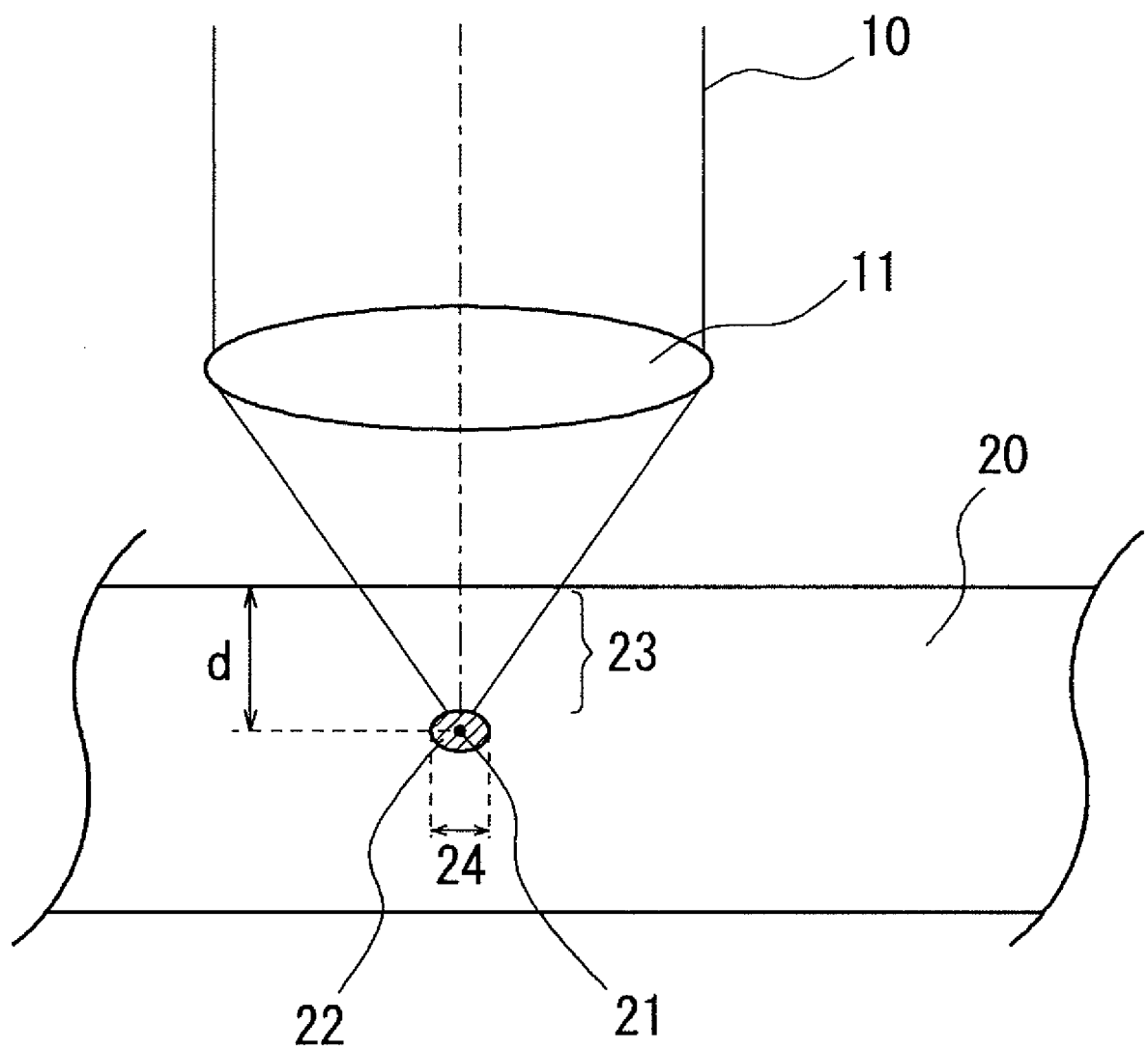
FIG. 1 is an enlarged cross-sectional view illustrating a vicinity of a focusing position of a laser beam immediately after the start in the irradiation of the laser beam to a semiconductor wafer.

The method of producing a semiconductor wafer according to the invention will be described with reference to the drawings. FIG. 1 is an enlarged cross-sectional view illustrating a vicinity of a focusing position of a laser beam immediately after the start in the irradiation of the laser beam to a semiconductor wafer.

A laser beam 10 is irradiated to either face of a semiconductor wafer 20 so as to fit a focusing position of the laser beam 10 into a given depth position 21 of the semiconductor wafer 20 with a collecting lens 11, and hence the laser beam 10 is focused in the given depth position 21 to generate a multiphoton absorption process to thereby form a modified portion 22.

In this case, it is important to irradiate the laser beam 10 under conditions of surely permeating a surface layer 23 as a path of the laser beam 10 without modifying the surface layer. In Table 1 are shown laser irradiating conditions suitable for general semiconductor material and Si semiconductor as an example.

The laser irradiating conditions are determined depending on a forbidden band (energy band gap) as a basic property of semiconductor materials. For example, the forbidden band of the Si semiconductor is 1.1 eV, so that the permeability becomes remarkable when an incident wavelength is not less than 1000 nm. Thus, the laser wavelength can be determined by considering the forbidden band of the semiconductor material.

TABLE 1

| | Laser irradiating conditions | |
| --- | --- | --- |
| | General semiconductor material | Si semiconductor |
| Beam wavelength | 300-1200 nm | 1000-1200 nm |
| Beam diameter | 0.1-100 μm | 0.5-1.0 μm |
| Repetition frequency | 0.001-100 MHz | 1-100 MHz |
| Pulse width | $1.0 \times 10^{-15}$-$1.0 \times 10^{-8}$ seconds | $1.0 \times 10^{-15}$-$1.0 \times 10^{-9}$ seconds |
| Output | 1-1000 mJ/pulse | 1-100 mJ/pulse |

As a laser beam generator is preferably used a low-power laser since a high-power laser such as a YAG laser or the like transmits thermal energy not only to the given depth position of the semiconductor wafer but also to a portion other than the above depth position. As the low-power laser is more preferably used an ultrashort pulsed-laser such as a femtosecond laser or the like. It is possible to provide the ultrashort pulsed-laser having a preferable laser wavelength range by exciting a titanium-sapphire crystal (solid-state laser crystal) with a semiconductor laser or the like. In the ultrashort pulsed-laser, the pulse width of the excited laser beam can be made to not more than $1.0 \times 10^{-15}$ (femto) seconds, so that the diffusion of thermal energy generated by excitation can be suppressed as compared with cases using other lasers, and hence light energy can be focused only in the vicinity of a focus point.

It is presumed that the modified portion 22 formed by the generation of the multiphoton absorption process is probably amorphous. In order to obtain such an amorphous structure, it is required that the given depth position 21 is locally and rapidly heated and cooled. Although the ultrashort pulsed-laser shown in Table 1 is a laser having a small amount of energy, energy enough to locally and rapidly heat the semiconductor wafer 20 can be provided by focusing the laser beam with the collecting lens 11. The temperature of the focusing position reaches a high temperature of 9900 to 10000 K. Moreover, the heat input range becomes very narrow owing to the focusing, so that when the focusing position is moved by scanning the laser beam as described later, the amount of heat input at the focusing position before the moving decreases rapidly, and hence the rapid cooling effect is obtained.

Also, since the wavelength of the ultrashort pulsed-laser shown in Table 1 is not less than 1000 nm, the permeability of the laser is high and it is made possible to form the modified portion 22 without affecting the crystalline structure of the surface layer 23. As a result, the modified portion 22 is preferable to be utilized as a gettering sink of the semiconductor wafer. When the wavelength exceeds 1200 nm, a photon energy (laser beam energy) is low owing to the long-wavelength region, and hence there is a fear that photon energy enough to modify the inside of the semiconductor can not be obtained even when the laser beam is focused with the collecting lens. Therefore, the wavelength is preferable to be not more than 1200 nm.

The position of the modified portion 22 or the distance d ranging from the surface of the semiconductor wafer 20 to the given depth position 21 thereof is controlled by focusing the laser beam 10 with the collecting lens 11 being excellent in the permeability at a near-infrared region and moving the position of the semiconductor wafer 20 up and down to form an image of focus point at the given depth position 21.

As the gettering sink of the semiconductor wafer, it is preferable that the given depth position 21 is about 0.5 μm and the width 24 is about 100 μm.

Figure 2:
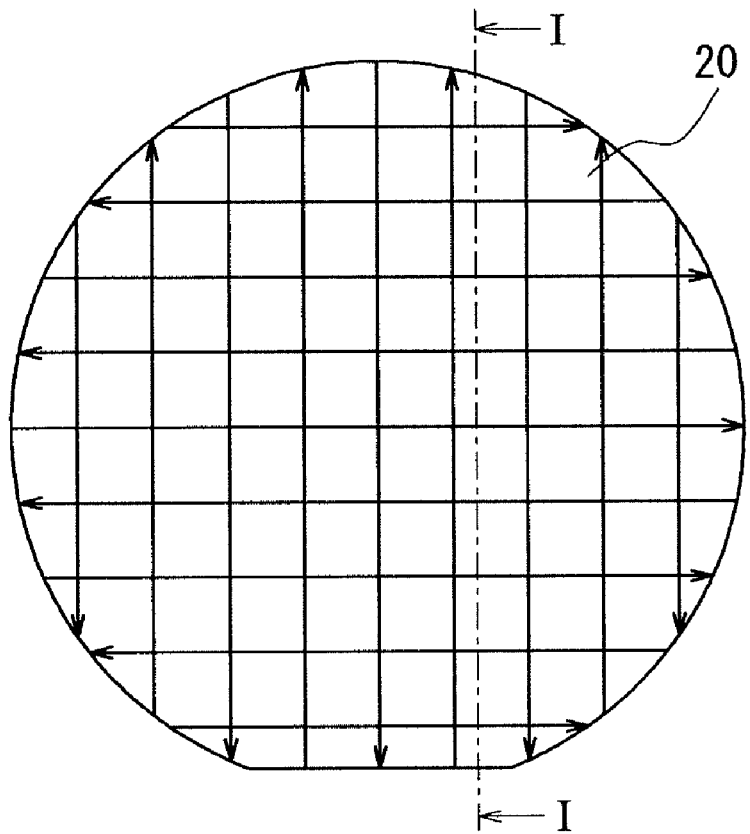
FIG. 2 is a schematic diagram showing a scanning direction of a laser beam irradiated to a semiconductor wafer viewing from a laser-beam irradiation side.

FIG. 2 is a schematic diagram showing a scanning direction of a laser beam irradiated to a semiconductor wafer viewing from a laser-beam irradiation side.

Moreover, each arrow shown in the semiconductor wafer 20 shows the scanning direction of the laser beam. An interval between the arrows or a scanning pitch can be set freely. The laser beam can be irradiated to the inside of the semiconductor wafer over a part or a whole of the wafer.

Figure 3:
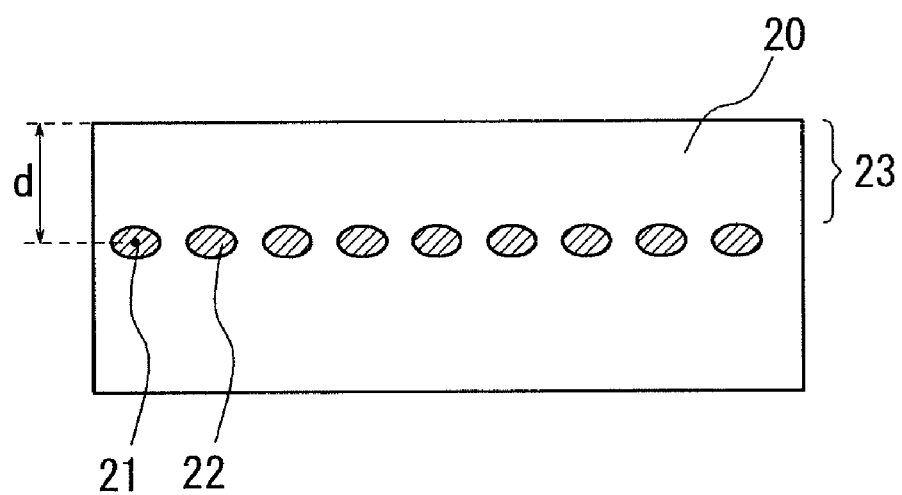
FIG. 3 is a cross-sectional view of a semiconductor wafer taken along a line I-I shown in FIG. 2 after the scanning of a laser beam.

FIG. 3 is a cross-sectional view of a semiconductor wafer taken along a line I-I shown in FIG. 2 after the scanning of a laser beam. The interval between the modified portions 22 or the density of the modified portions 22 can be set by the scanning pitch. For the gettering sink of the semiconductor wafer, the density of the modified portions 22 is preferable to be within a range of $1.0 \times 10^5$ to $1.0 \times 10^6$ precipitates/cm$^2$. The density of the modified portions means the number of oxygen precipitates obtained by observing the cross-section of the wafer by means of TEM (transmission electron microscope).

Next, the laser optical system used in the production method of the semiconductor wafer according to the invention will be explained.

Figure 4:
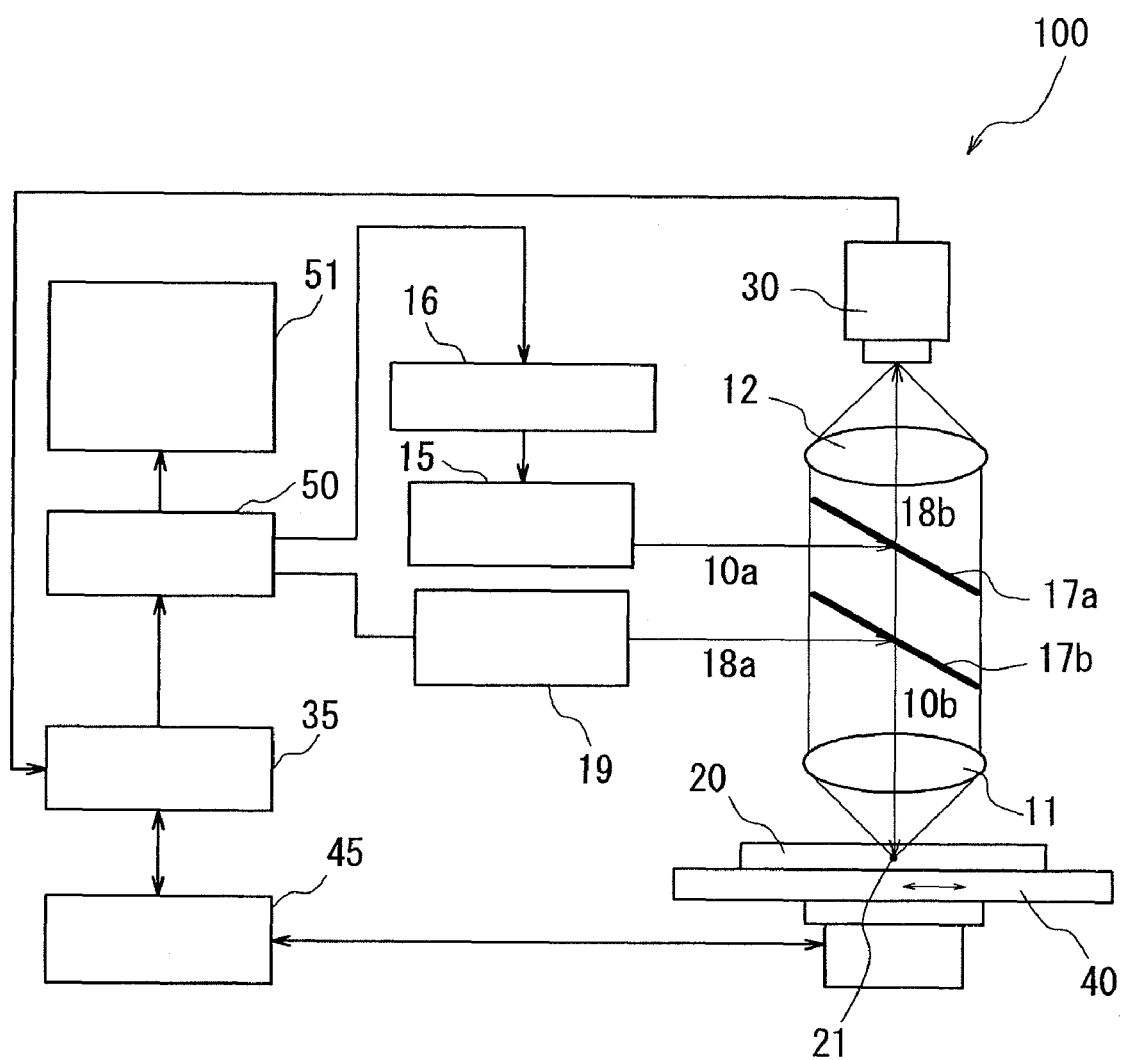
FIG. 4 is a schematic view showing an example of a laser optical system used in a production method of a semiconductor wafer according to the invention.

FIG. 4 is a schematic view showing an example of a laser optical system used in a production method of a semiconductor wafer according to the invention.

A laser optical system 100 comprises a semiconductor wafer 20 to be irradiated with a laser beam 10b, a laser generator 15 pulse-oscillating a laser beam 10a, a pulse control circuit (Q switch) 16 controlling pulse and the like of the laser beam, a beam splitter (half mirror) 17a disposed so as to reflect the laser beam 10a and change the traveling direction thereof by 90°, a collecting lens 11 collecting the laser beam 10b reflected by the beam splitter (half mirror) 17a, a stage 40 being movable in vertical and horizontal directions so as to focus the collected laser beam 10b to an arbitrary position of the semiconductor wafer and a stage control circuit 45 controlling the movement of the stage 40.

The laser generator 15 and the pulse control circuit (Q switch) 16 are not particularly limited as long as they can generate a laser beam within a preferable range shown in Table 1. However, it is preferable to use a titanium-sapphire laser having a permeable laser wavelength and capable of oscillating in a short pulse period for forming a modified portion in an arbitrary position inside a semiconductor material.

The laser beam 10a generated by the laser generator 15 is reflected by the beam splitter (half mirror) 17a to change its traveling direction by 90° and focused into the laser beam 10b with the collecting lens 11, which is formed as an image of a focus point at the given depth position 21 of the semiconductor wafer 20 by moving the stage 40 in a vertical direction through computer control. The collecting lens 11 is preferable to have a magnification of 10 to 300 times, N.A. of 0.3 to 0.9 and a transmittance to wavelength of the laser beam of 30 to 60%.

For example, when a modified portion is formed at a depth position of 2 μm from the surface of the wafer, the wavelength of the laser beam is set to 1080 nm and the collecting lens having a transmittance of 60% (magnification of 50 times) is used, whereby the laser beam can be focused at the depth position of 2 μm from the surface of the wafer to generate a multiphoton absorption process to thereby form a modified portion.

The laser optical system 100 further comprises a visible light laser generator 19, a beam splitter (half mirror) 17b, a CCD camera 30, a CCD camera control circuit 35, an imaging lens 12, a central control circuit 50 and a display means 51.

A visible light laser beam 18a generated by the visible light laser generator 19 is reflected by the beam splitter (half mirror) 17b to change its traveling direction by 90°, which irradiates the semiconductor wafer 20 and is reflected on the surface of the semiconductor wafer 20 to arrive at the imaging lens 12 through the collecting lens 11 and the beam splitters 17a and 17b. The visible light laser beam 18b arrived at the imaging lens 12 is taken as an image by the CCD camera 30 via the imaging lens 12 and then input to the CCD camera control circuit as image data. The stage 40 is moved horizontally according to data output from the stage control circuit 45 based on the input data, whereby the laser beam scanning as shown in FIG. 2 can be attained.

The size of the modified portion formed by the laser beam scanning as mentioned above is preferable to be thin as a layer and may be within a range of 10 to 150 μm.

Moreover, although the above is described with respect to only one embodiment of the invention, various modifications may be made without departing from the scope of the appended claims.

Example

A silicon wafer having a diameter of 300 mm and a thickness of 0.725 mm is irradiated with a laser beam under conditions shown in Table 2 to prepare a silicon wafer provided with a modified portion having a density of $10^{-6}/cm^2$ at a depth position of 2 μm from the surface of the wafer irradiated with the laser beam.

TABLE 2

| | Irradiating conditions |
|---|---|
| Beam wavelength | 1080 nm |
| Beam diameter | 1.0 μm |
| Repetition frequency | 1 MHz |
| Pulse width | $1.0 \times 10^{-9}$ seconds |
| Output | 100 mJ/pulse |

Comparative Example 1

In order to confirm the gettering effect of the modified portion, the same silicon wafer as in Example is provided except that the silicon wafer is not irradiated with a laser beam.

Comparative Example 2

In order to confirm the gettering effect when an oxygen precipitation portion is formed by a long-time heat treatment, the same silicon wafer as in Comparative Example 1 is provided except that the wafer is subjected to a heat treatment for 10 hours or 20 hours.

Evaluation Method

The gettering effect of each sample prepared in the above Example and Comparative Examples 1 and 2 is evaluated by the following method.

Each sample is washed with a mixed solution of ammonia and hydrogen peroxide and further with a mixed solution of hydrochloric acid and hydrogen peroxide and then contaminated at its surface with nickel at an amount of about $1.0 \times 10^{12}$ atoms/cm$^2$ by a spin coating contamination method. Thereafter, the sample is subjected to a diffused heat treatment in a vertical heat-treating furnace at 1000° C. in a nitrogen atmosphere for 1 hour and then etched with a Wright solution (48% HF: 30 ml, 69% HNO$_3$: 30 ml, CrO$_3$ 1 g+H$_2$O: 2 ml, acetic acid: 60 ml) and the number of etch pit (pit formed by etching of nickel silicide) on the surface is observed by means of an optical microscope to measure the etch pit density (pits/cm$^2$) for the evaluation of the gettering ability. The measurement limit of the etch pit density in this method is $1.0 \times 10^3$ pits/cm$^2$. The gettering ability is assessed as excellent when the etch pit density is not more than $1.0 \times 10^3$ pits/cm$^2$ (not more than measurement limit), as acceptable when it is more than $1.0 \times 10^3$ pits/cm$^2$ but less than $1.0 \times 10^5$ pits/cm$^2$ and as unacceptable when it is $1.0 \times 10^5$ pits/cm$^2$ or more.

In Comparative Example 2, the time required for the formation of the oxygen precipitation portion as a gettering sink is evaluated as follows.

Each sample is cleaved in a (110) direction and etched with Wright solution, thereafter the cleaved face (cross section of the sample) is observed by means of an optical microscope to measure the oxygen precipitate density (precipitates/cm$^2$). The gettering ability is evaluated by contaminating the surface with nickel element in the same manner as in Example 1.

As a result of the evaluation, the etch pit density is $1.0 \times 10^5$ pits/cm$^2$ and no gettering effect is confirmed in Comparative Example 1.

In Comparative Example 2, the sample subjected to the heat treatment for 10 hours has an oxygen precipitate density of $1.0 \times 10^4$ precipitates/cm$^2$ and an etch pit density of $1.0 \times 10^5$ pits/cm$^2$, and hardly shows the gettering effect. In addition, the sample subjected to the heat treatment for 20 hours has an oxygen precipitate density of $1.0 \times 10^5$ precipitates/cm$^2$ and an etch pit density of $1.0 \times 10^4$ pits/cm$^2$, and shows only some gettering effect.

On the contrary, the sample in Example has an etch pit density of not more than $1.0\times10^3$ pits/cm$^2$ and shows the sufficient gettering effect.

As seen from the above, the modified portion formed by irradiating laser beams in a short time to generate a multiphoton absorption process only at a given depth position of the silicon wafer serves effectively as a gettering sink.

According to the invention, it is made possible to produce a semiconductor wafer provided with a modified portion by generating a multiphoton absorption process only at a given depth position of the semiconductor wafer through irradiation of a laser beam for a short time and to utilize the modified portion as a gettering sink even when the wafer has a large diameter of not less than 300 mm.

What is claimed is:

1. A method of producing a semiconductor wafer, which comprises irradiating a laser beam to either face of a semiconductor wafer so as to fit a focusing position into a given depth position of the semiconductor wafer to generate a multiphoton absorption process only in specific portions of the semiconductor wafer at the given depth position, wherein the multiphoton absorption process modifies the specific portions of the wafer such that the specific portions become modified portions, wherein the modified portions comprise oxygen precipitates and act as a gettering sink; wherein the oxygen precipitates have a density within a range of $1.0\times10^5 \sim 1.0\times10^6$ precipitates per cm$^2$ of the cross-sectional area of the wafer.

2. A method of producing a semiconductor wafer according to claim 1, wherein the laser beam has a property of permeating into the given depth position of the semiconductor wafer and generating the multiphoton absorption process only in the specific portion of the semiconductor wafer at the given depth position.

3. A method of producing a semiconductor wafer according to claim 2, wherein the laser beam is an ultrashort pulsed-laser.

4. A method of producing a semiconductor wafer according to claim 2, wherein the semiconductor wafer is locally and rapidly heated by focusing the laser beam with a collecting lens.

5. A method of producing a semiconductor wafer according to claim 1, wherein the laser beam is an ultrashort pulsed-laser.

6. A method of producing a semiconductor wafer according to claim 1, wherein the laser beam irradiation is effected by using a laser beam having a repetition frequency in the range of 1 to 100 MHz such that the gettering sink is formed only at a depth position of 2 μm or less from the face of the wafer irradiated with the laser beam.

7. A method of producing a semiconductor wafer according to claim 1, including forming the gettering sink to have a width of approximately 100 μm.

* * * * *